(12) United States Patent
Lee et al.

(10) Patent No.: US 7,232,731 B2
(45) Date of Patent: Jun. 19, 2007

(54) METHOD FOR FABRICATING TRANSISTOR OF SEMICONDUCTOR DEVICE

(75) Inventors: Sang Gi Lee, Bucheon-si (KR); Chang Eun Lee, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 58 days.

(21) Appl. No.: 11/023,522

(22) Filed: Dec. 29, 2004

(65) Prior Publication Data

US 2005/0142774 A1 Jun. 30, 2005

(30) Foreign Application Priority Data

Dec. 31, 2003 (KR) ............... 10-2003-0101049
Dec. 31, 2003 (KR) ............... 10-2003-0101981

(51) Int. Cl.
*H01L 21/336* (2006.01)
*H01L 21/44* (2006.01)
*H01L 21/4763* (2006.01)

(52) U.S. Cl. .............. 438/305; 438/682; 438/683; 438/649; 438/199; 257/E21.444; 257/E21.193; 257/E21.415; 257/E21.434

(58) Field of Classification Search .......... 438/199, 438/231, 305, 682, 683, 649; 257/E21.444, 257/E21.193, E21.415, E21.434
See application file for complete search history.

(56) References Cited

U.S. PATENT DOCUMENTS

| 5,811,354 A | * | 9/1998 | Yzng | ............... 438/682 |
| 6,287,968 B1 | | 9/2001 | Yu et al. | |
| 6,492,734 B2 | | 12/2002 | Watanabe | |
| 6,524,950 B1 | | 2/2003 | Lin | |
| 2001/0009292 A1 | * | 7/2001 | Nishinohara et al. | ....... 438/217 |
| 2004/0140518 A1 | * | 7/2004 | Lee | ............... 257/506 |
| 2005/0233514 A1 | * | 10/2005 | Bu et al. | ............... 438/199 |
| 2006/0008973 A1 | * | 1/2006 | Phua et al. | ............... 438/231 |

* cited by examiner

*Primary Examiner*—Walter L. Lindsay, Jr.
(74) *Attorney, Agent, or Firm*—Finnegan, Henderson, Farabow, Garrett, & Dunner, L.L.P.

(57) ABSTRACT

A method for fabricating a transistor of semiconductor is disclosed. A disclosed method comprises: forming an STI structure and a well region in a silicon substrate; forming a first dummy gate electrode including spacers and a first gate oxide layer on the well region; forming source and drain regions including an LDD structure around the first dummy gate electrode by using the first dummy gate electrode and the spacers as a ion implantation mask, and performing a thermal treatment; removing the first dummy gate electrode and the first gate oxide layer under the first dummy gate electrode; forming a second dummy gate electrode and a second gate oxide layer; forming a thin nitride layer and a PMD on the silicon substrate including the second dummy gate electrode; performing a CMP process for the thin nitride layer and the PMD until the top of the spacers is exposed; removing the second dummy gate electrode and the second gate oxide layer; forming a third gate oxide layer and polysilicon for a gate electrode; performing another CMP process until the top of the spacers is exposed; and additionally etching the upper portion of the gate electrode.

8 Claims, 6 Drawing Sheets

METHOD FOR FABRICATING TRANSISTOR OF SEMICONDUCTOR DEVICE

BACKGROUND OF THE INVENTION

1. Field of the Invention

The present disclosure relates generally to a semiconductor fabrication and, more particularly, to a method for fabricating a transistor of a semiconductor device.

2. Background of the Related Art

As the integration degree in semiconductor devices advances, the width of a gate electrode, a thickness of a gate insulating layer, and the junction depth of source and drain regions decrease as well. Because a gate electrode made of polysilicon can not achieve a low resistance required in a fine interconnect, a new material and structure for the gate electrode is required to replace the conventional polysilicon. As a result, polycide made of transition metal-silicide has been suggested. However, the polycide gate electrode still has a difficulty in controlling the sheet resistance due to the polysilicon therein. The polycide gate electrode also has several problems such as an increase in an effective thickness of the gate insulating layer due to the gate depletion effect, boron penetration in a p$^+$ polysilicon gate electrode and the variation of the threshold voltage due to the fluctuation of a dopant distribution.

Hence, to obviate such problems in polycide as described above, intensive research and development for a metal gate electrode is in progress. Because the metal gate electrode does not require any dopant, the gate depletion and the boron penetration can be effectively and efficiently prevented. In addition, the metal gate electrode can be used for both a PMOS and an NMOS transistor by using metals whose a work function corresponds to a mid bandgap of silicon. Here, such metals the metal include W, WN, Ti, TiN, Mo, Ta and TaN.

However, the metal gate electrode has still another problem such as a difficulty in the etch for patterning a desired gate electrode, plasma damages due to an etch and an ion implantation processes, and thermal damages due to later processes, which may detrimentally affect the characteristics of the semiconductor device.

Accordingly, to obviate such problems of the metal electrode as described above, a damascene gate process using the metal gate electrode has been suggested. The damascene gate process using the metal gate electrode generally comprises steps as follows. First, a dummy gate electrode made of polysilicon is formed. Next, an ILD (Inter-Layer Dielectric layer) is formed and the dummy gate electrode is removed. Next, a metal is filled where the dummy gate electrode has been removed and, subsequently, a planarization process such as a CMP (Chemical Mechanical Polishing) is performed. Finally, a metal gate electrode is completed. The resulting metal gate electrode has not been affected by the etching process and, therefore, various problems due to the etching process can be prevented. Moreover, the conventional semiconductor fabrication method can be adopted for the damascene gate process.

FIGS. 1a through 1g are cross-sectional views illustrating a MOSFET device in accordance with the conventional damascene gate process.

Referring to FIG. 1a, an active region is defined in a semiconductor substrate 1 by field oxide (not shown). A silicon oxide layer 2 is then grown on the active region. Subsequently, polysilicon 3 for a dummy gate electrode is deposited on the silicon oxide layer 2. A hard mask layer 4 is then deposited on the polysilicon 3.

Referring to FIG. 1b, a mask pattern 4a is formed by patterning the hard mask layer 4. Subsequently, the polysilicon 3 and the silicon oxide layer 2 are etched to form a dummy gate electrode 5 by using the mask pattern 4a.

Referring to FIG. 1c, an LDD structure is formed adjacent to the dummy gate electrode 5 by implanting low concentration ions. Spacers 6 are then formed on the lateral faces of the dummy gate electrode 5. Source and drain regions with the LDD structure are formed around the dummy gate electrode 5 by implanting high concentration ions.

Referring to FIG. 1d, an ILD 7 is formed covering the resulting structure. Next, the ILD is then planarized by a CMP process until the top surface of the dummy gate electrode 5 is exposed. Subsequently, the exposed dummy gate 5 is removed.

Referring to FIG. 1e, a gate insulating layer 8 is formed along the surface of the resulting structure. A metal 9 for a gate electrode such as tungsten is deposited on the gate insulating layer 8.

Referring to FIG. 1f, the metal 9 for the gate electrode and the gate insulating layer 8 is polished until the IDL 7 is exposed.

However, in the conventional damascene gate process, as the width of the gate electrode decreases to less than 90 nm, an adequate sheet resistance of silicide on the gate electrode is difficult to achieve. Thus, Ni silicide which can be formed at a low temperature has been suggested to obtain the proper sheet resistance without the change of the junction depth of the source and drain regions. However, the Ni silicide also has a difficulty in ensuring a sufficient area without the change of the junction depth of the source and the drain regions.

In particular, as the width of the gate electrode decreases, the thickness of the silicide on the gate electrode increases to improve the resistance characteristic of the silicide and, thereby, a bridge effect arises between the gate electrode and the source and drain regions as well as a leakage current.

SUMMARY OF INVENTION

An object of the present invention is to provide a method for forming a sufficiently thick silicide layer on a gate electrode of sub-90 nm without changing a junction depth in a damascene gate process, thereby decreasing the resistance of the silicide layer and improving access time on a circuit.

Another object of the present invention is to provide a method for adjusting the resistance of the gate electrode by controlling the thickness of polysilicon to be polished by a CMP process in a damascene gate process.

To achieve these objects and other advantages and in accordance with the purpose of the invention, as embodied and broadly described herein, the present invention provides a method for fabricating a transistor of a semiconductor comprising steps: forming an STI structure and a well region in a silicon substrate; forming a first dummy gate electrode including spacers and a first gate oxide layer on the well region; forming source and drain regions including an LDD structure around the first dummy gate electrode by using the first dummy gate electrode and the spacers as a ion implantation mask, and performing a thermal treatment; removing the first dummy gate electrode and the first gate oxide layer under the first dummy gate electrode; forming a second dummy gate electrode and a second gate oxide layer; forming a thin nitride layer and a PMD on the silicon substrate including the second dummy gate electrode; performing a CMP process for the thin nitride layer and the PMD until the top of the spacers is exposed; removing the second dummy gate electrode and the second gate oxide layer; forming a third gate oxide layer and polysilicon for a gate electrode; performing another CMP process until the top of the spacers is exposed; and additionally etching the upper portion of the gate electrode.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

FIGS. 2a through 2f are cross-sectional views illustrating a transistor by a damascene gate process in accordance with the present invention.

Figure 1A:
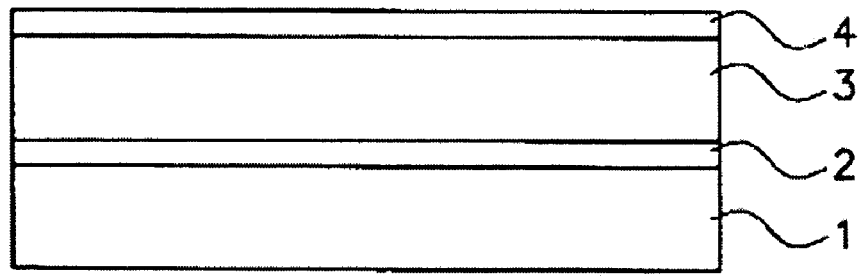
FIGS. 1a through 1f are cross-sectional views illustrating a transistor by a damascene gate process in accordance with a conventional method.
Figure 1B:
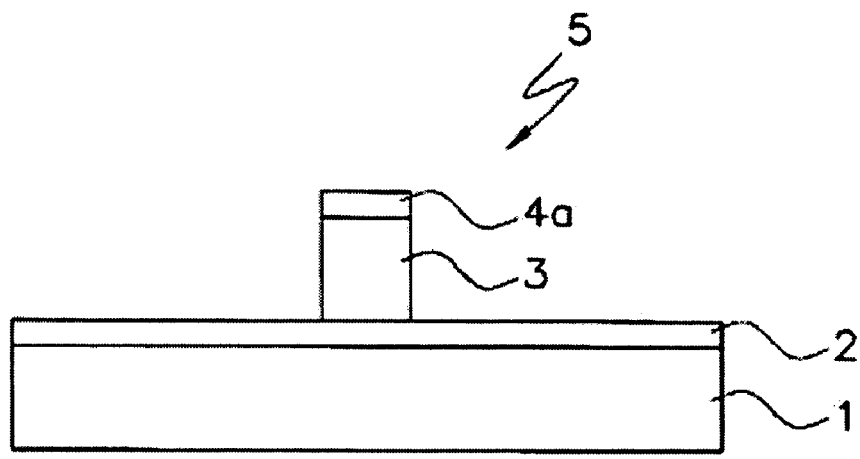
Figure 1C:
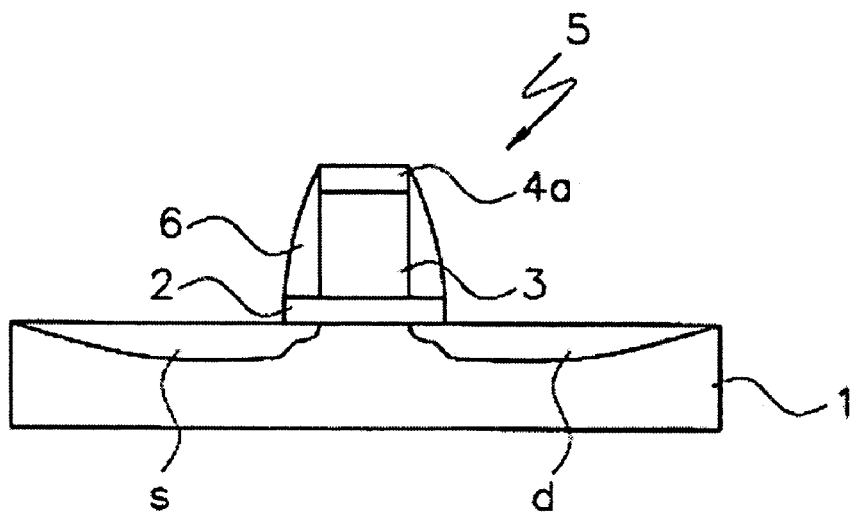
Figure 1D:
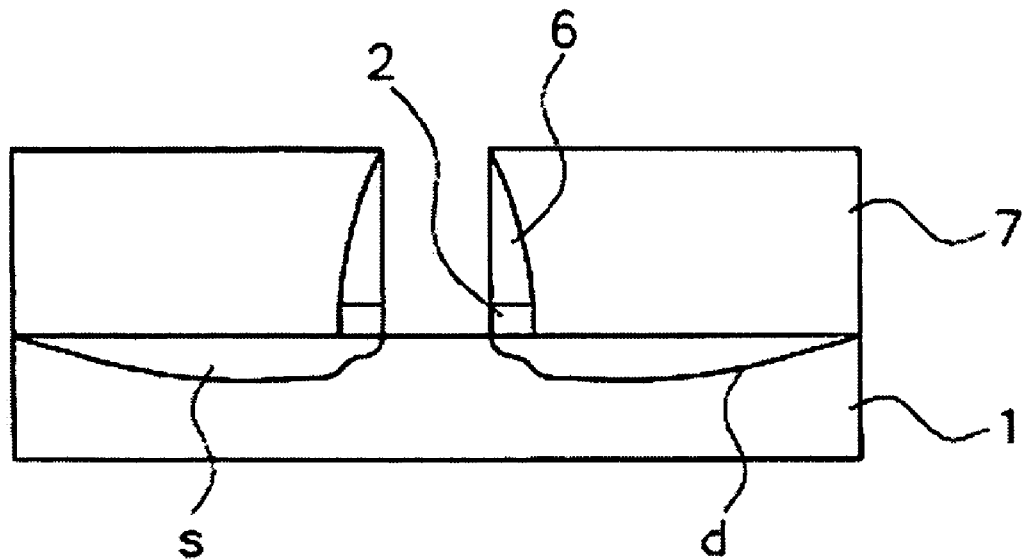
Figure 1E:
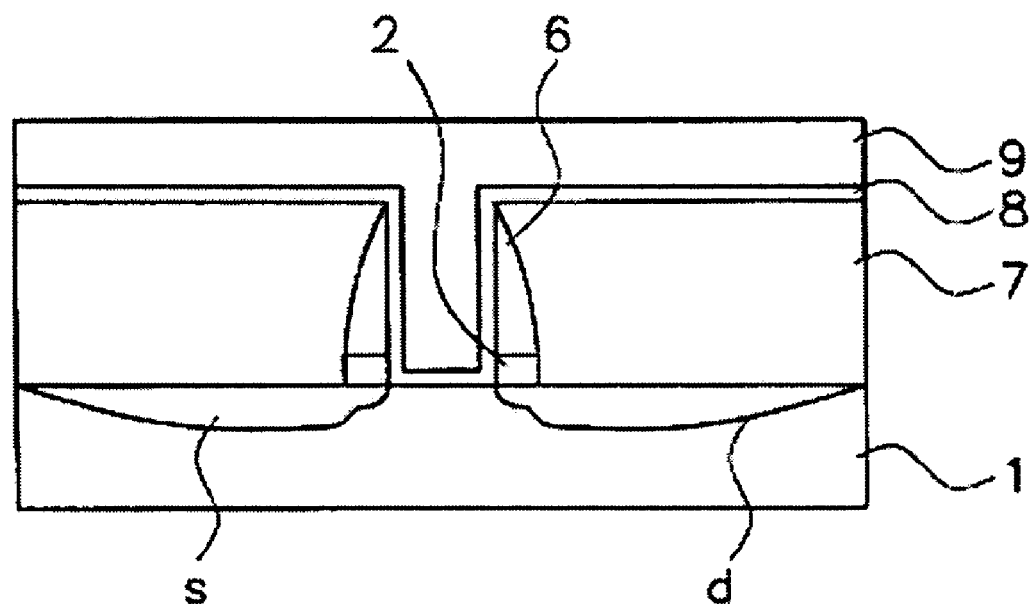
Figure 1F:
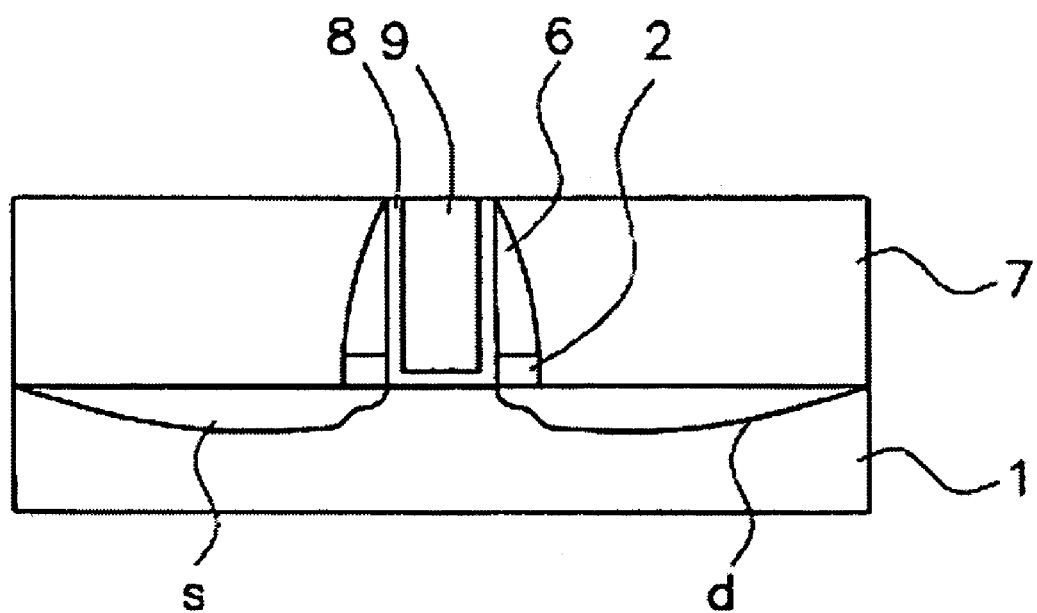
Figure 2A:
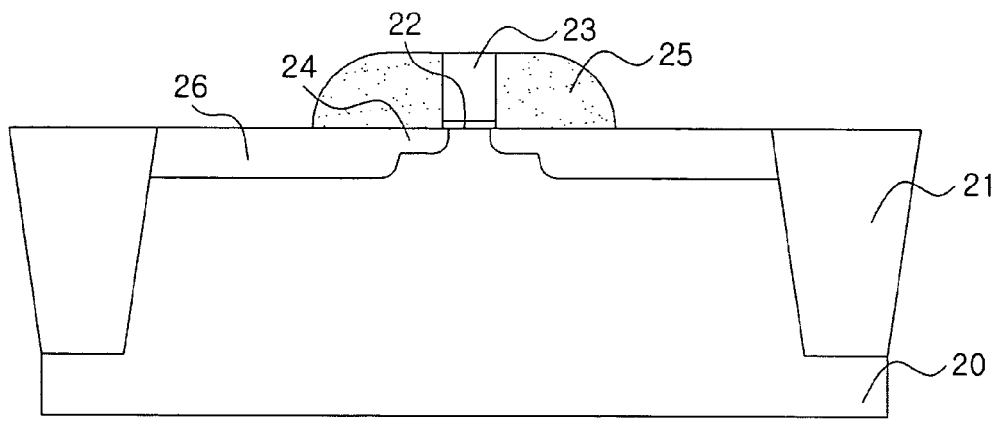
FIGS. 2a through 2f are cross-sectional views illustrating a transistor by a damascene gate process in accordance with the present invention.

Referring to FIG. 2a, STI structures 21 are formed in a silicon substrate 20 and an active region (not shown) is defined. A well region (not shown) is formed by implanting ions into the silicon substrate 20. A first gate oxide layer 22 is formed on the active region. Polysilicon 23 for a first dummy gate electrode is deposited on the first gate oxide layer. After a mask pattern for the first dummy gate electrode is formed on the polysilicon 23, the first dummy gate electrode is formed by etching the polysilicon 23 with the mask pattern as an etch mask. Subsequently, LDD structures 24 are formed by implanting low concentration ions around the first gate electrode in the substrate 20. Spacers 25 are then formed on the lateral faces of the first dummy gate electrode. Source and drain regions 26 are then formed by implanting high concentration ions around the first dummy gate electrode in the silicon substrate 20 with the first dummy gate electrode and the spacers 25 as an ion implantation mask. Subsequently, an RTA (Rapid Thermal Annealing) is performed to suppress the diffusion of the implanted ions.

Figure 2B:
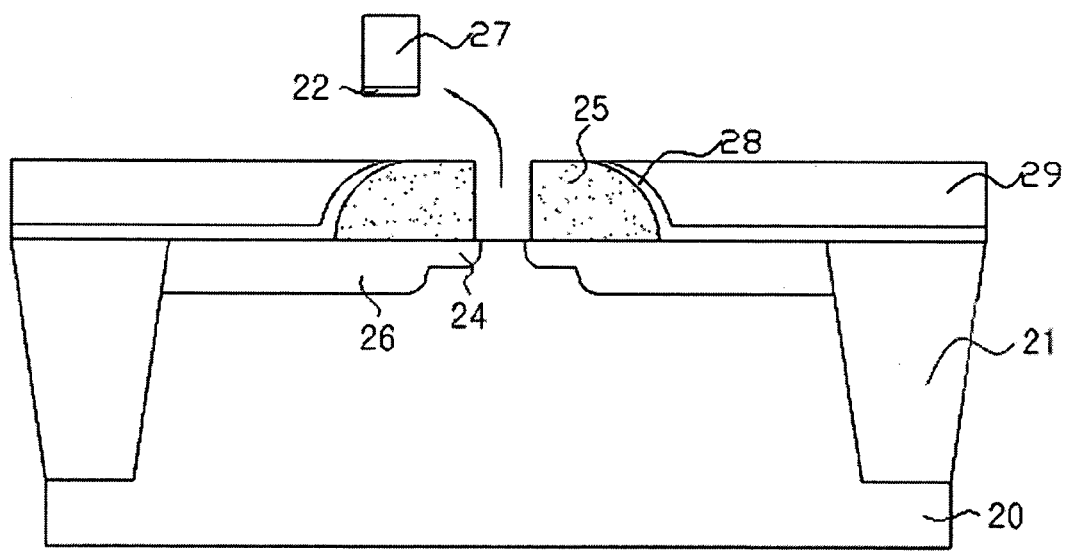

Referring to FIG. 2b, after the first dummy gate electrode 27 and the first dummy gate oxide layer 22 are removed, a second gate oxide layer (not shown) is formed by a plasma oxidation process where the first gate oxide layer 22 has been removed. Subsequently, polysilicon (not shown) for a second dummy gate electrode is deposited. A thin nitride layer 28 is then formed on the entire surface of the substrate including the spacers 25. A PMD (Pre-Metallic Dielectric layer) 29 is then formed on the thin nitride layer 28. Subsequently, a CMP process is performed until the top of the spacers 25 is exposed. Next, the second dummy gate and the second oxide layer are then removed by a wet etch and a damascene pattern is completed.

Figure 2C:
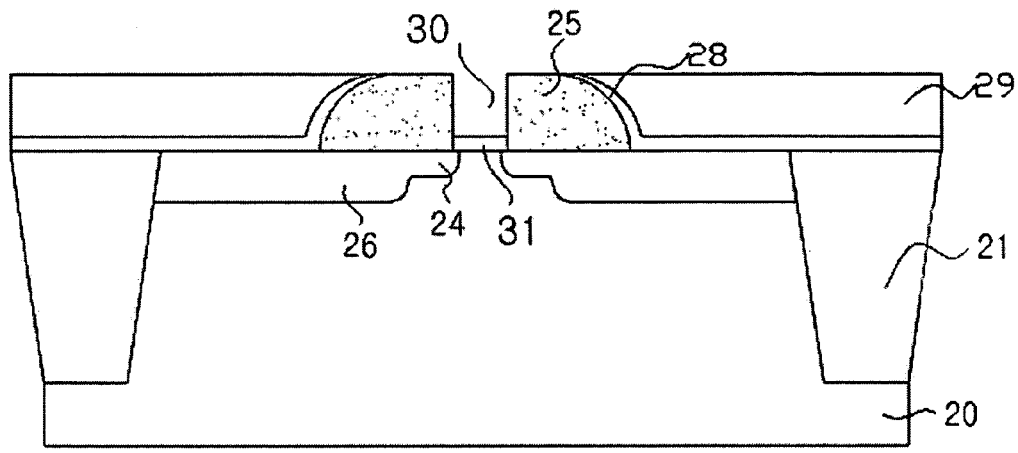

Referring to FIG. 2c, a third gate oxide layer 31 is deposited with a predetermined thickness in the damascene pattern 30. The third gate oxide layer 31 is made of a material with a high dielectric constant, which can be adopted in a sub-90 nm device fabrication.

Figure 2D:
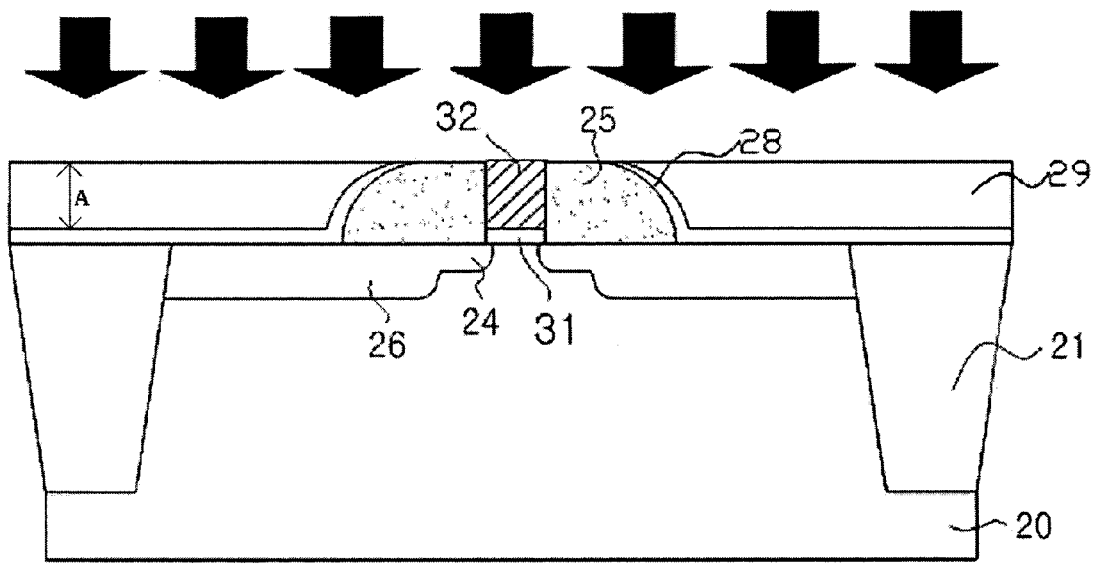

Referring to FIG. 2d, polysilicon 32 for a gate electrode is deposited on the third gate oxide layer 31. Subsequently, a CMP process is then performed until the top of the spacers 25 are exposed. The thickness A remaining after the CMP process is easily adjustable. Thus, the resistance of the polysilicon can be controlled by adjusting the thickness A as far as the relationship between the thickness and the sheet resistance is known.

Figure 2E:
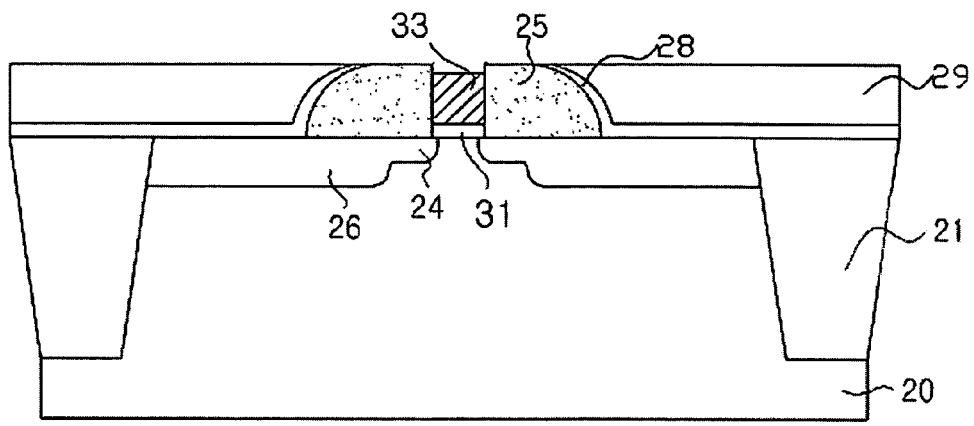

Referring to FIG. 2e, the upper portion of the planarized gate electrode 33 is additionally wet-etched by 300 Å to 500 Å.

Figure 2F:
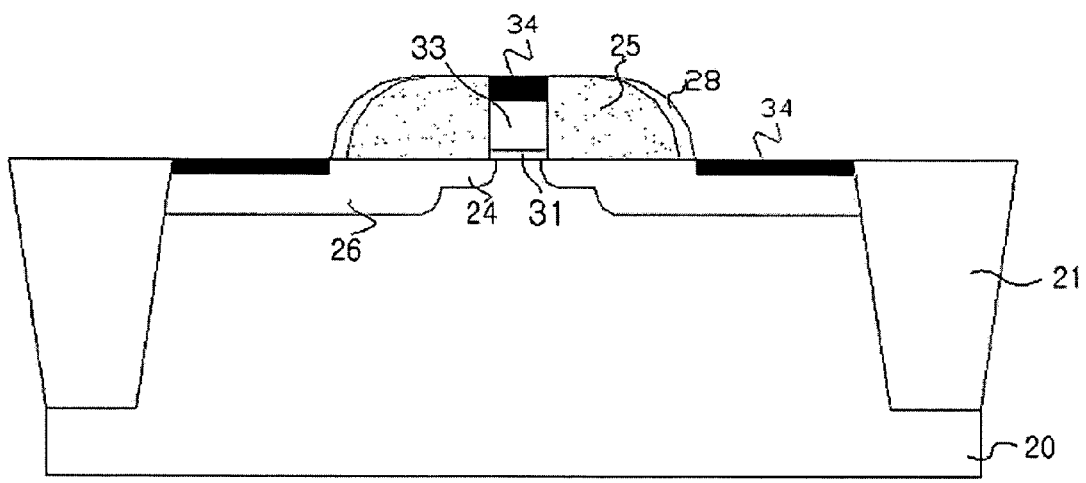

Referring to FIG. 2f, after a pattern for exposing the source and the drain 26 is formed on the resulting structure, the PMD 26 and the thin nitride layer 28 except on the spacers 25 are removed by using the pattern. Subsequently, a silicide layer 34 is formed on the top of the gate electrode 33 and the source and drain regions 26. The silicide layer 34 is made of Co or Ni silicide.

Accordingly, the present invention can decrease the sheet resistance by forming the sufficiently thick silicide layer on the gate electrode, thereby improving access time on a circuit. And, the silicide layer on the source and drain regions maintains the thickness in the prior art without changing the junction depth, and thus the occurrence of the leakage current is minimized. Additionally, even in a sub-90 nm device fabrication process, Co can be used for forming the silicide layer instead of Ni. Moreover, the present invention can control the resistance of the gate electrode by adjusting the thickness to be planarized by the CMP process.

It is noted that this patent claims priority from Korean Patent Application Serial Number 10-2003-0101049 and 10-2003-0101981,which were filed on Dec. 31, 2003,and are hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a transistor of a semiconductor device comprising:
   forming an STI structure and a well region in a silicon substrate;
   forming a first dummy gate electrode including spacers and a first gate oxide layer on the well region;
   forming source and drain regions around the first dummy gate electrode by using the first dummy gate electrode and the spacers as an ion implantation mask, and performing a thermal treatment;
   removing the first dummy gate electrode and the first gate oxide layer;
   forming a second dummy gate electrode and a second gate oxide layer;
   forming a thin nitride layer and a PMD on the silicon substrate including the second dummy gate electrode;
   performing a CMP process for the thin nitride layer and the PMD until the top of the spacers is exposed;
   removing the second dummy gate electrode and the second gate oxide layer;
   forming a third gate oxide layer and polysilicon for a gate electrode;
   performing another CMP process until the top of the spacers is exposed; and
   etching the upper portion of the gate electrode,
   wherein forming a first dummy gate electrode including the spacers and a first gate oxide layer on the well region comprises:

forming a first gate oxide layer on the silicon substrate including the well region; depositing polysilicon for first dummy gate electrode;

patterning the first gate oxide layer and the polysilicon into a first dummy gate;

forming a LDD structure around the first dummy gate electrode;

depositing a nitride layer on the entire surface of the substrate; and forming the spacers on the lateral faces of the first dummy gate electrode by patterning the nitride layer.

2. A method as defined by claim 1, further comprising forming a silicide layer on the top of the gate electrode and the source and drain regions after the upper portion of the gate electrode is etched.

3. A method as defined by claim 2, wherein the suicide layer is made of Co or Ni.

4. A method as defined by claim 1, wherein the thermal treatment is performed at about 800° C.

5. A method as defined by claim 1, wherein the second gate oxide layer is formed by a plasma oxidation process.

6. A method as defined by claim 1, wherein the third gate oxide layer is made of a material having a high dielectric constant.

7. A method as defined by claim 1, wherein the gate electrode is additionally wet-etched by 300 Å to 500 Å.

8. A method as defined by claim 1, wherein the thermal treatment is an RTA.

* * * * *